United States Patent
Horibe et al.

(10) Patent No.: US 10,672,638 B2
(45) Date of Patent: Jun. 2, 2020

(54) PICKING UP IRREGULAR SEMICONDUCTOR CHIPS

(71) Applicant: INTERNATIONAL BUSINESS MACHINES CORPORATION, Armonk, NY (US)

(72) Inventors: Akihiro Horibe, Kawasaki (JP); Kuniaki Sueoka, Kawasaki (JP)

(73) Assignee: International Business Machines Corporation, Armonk, NY (US)

(*) Notice: Subject to any disclaimer, the term of this patent is extended or adjusted under 35 U.S.C. 154(b) by 25 days.

(21) Appl. No.: 15/418,020

(22) Filed: Jan. 27, 2017

(65) Prior Publication Data
US 2018/0218952 A1 Aug. 2, 2018

(51) Int. Cl.
*H01L 21/683* (2006.01)
*H01L 21/67* (2006.01)
(Continued)

(52) U.S. Cl.
CPC .. *H01L 21/67721* (2013.01); *H01L 21/67132* (2013.01); *H01L 21/67144* (2013.01); *H01L 21/67259* (2013.01); *H01L 21/687* (2013.01); *H01L 21/6836* (2013.01); *H01L 21/6838* (2013.01); *H01L 24/81* (2013.01); *H01L 24/95* (2013.01); *H01L 25/50* (2013.01); *H01L 22/12* (2013.01); *H01L 24/16* (2013.01); *H01L 25/0655* (2013.01);
(Continued)

(58) Field of Classification Search
CPC ............... H01L 22/22; H01L 21/67721; H01L 21/67259; H01L 21/67005; H01L 21/673; H01L 21/6836; H01L 21/67132; H01L 21/67144; H01L 21/6838; H01L 21/687
See application file for complete search history.

(56) References Cited

U.S. PATENT DOCUMENTS 3,720,309 A * 3/1973 Weir ...................... B07C 5/344
156/250
7,214,563 B2 * 5/2007 Ishikawa .......... G06K 19/07749
438/106
(Continued)

FOREIGN PATENT DOCUMENTS

CN 102861959 B 6/2016
EP 1470747 B1 5/2014
(Continued)

OTHER PUBLICATIONS

BaumTronics, "Vacuum pick-up too" Product No. YH-993Dpen, URL: http://baumtronics.com/product_info.php/vacuum-pick-up-tool-p-166, viewed on Nov. 8, 2016, 1 page.

*Primary Examiner* — Phat X Cao
(74) *Attorney, Agent, or Firm* — Tutunjian & Bitetto, P.C.; Vazken Alexanian

(57) ABSTRACT

A chip pickup system is provided. The chip pickup system includes a detector for detecting a position of an irregular semiconductor chip on a holder. The holder holding plural semiconductor chips in predetermined positions on the holder. The irregular semiconductor chip is out of the predetermined positions. The system further includes a pickup tool for picking up the irregular semiconductor chip at least on the basis of information on the position of the irregular semiconductor chip detected by the detector.

17 Claims, 12 Drawing Sheets

(51) Int. Cl.
  *H01L 21/687* (2006.01)
  *H01L 21/677* (2006.01)
  *H01L 25/00* (2006.01)
  *H01L 23/00* (2006.01)
  *H01L 21/66* (2006.01)
  *H01L 25/065* (2006.01)

(52) U.S. Cl.
  CPC ............... *H01L 2221/68322* (2013.01); *H01L 2221/68327* (2013.01); *H01L 2221/68354* (2013.01); *H01L 2221/68368* (2013.01); *H01L 2224/16227* (2013.01); *H01L 2224/81001* (2013.01); *H01L 2224/81191* (2013.01); *H01L 2224/81908* (2013.01); *H01L 2224/95001* (2013.01); *H01L 2224/9512* (2013.01); *H01L 2224/97* (2013.01); *H01L 2924/00014* (2013.01)

(56) References Cited

U.S. PATENT DOCUMENTS

| | | |
|---|---|---|
| 8,197,161 B2 | 6/2012 | Strom |
| 9,633,883 B2 * | 4/2017 | Huska ................... H01L 21/681 |
| 2008/0014073 A1 * | 1/2008 | Moore .............. H01L 21/67132 |
| | | 414/796 |
| 2012/0168089 A1 * | 7/2012 | Schmidt-Lange ..... B65G 47/91 |
| | | 156/538 |
| 2018/0204749 A1 * | 7/2018 | Huska ............... H01L 21/67778 |

FOREIGN PATENT DOCUMENTS

| | | | |
|---|---|---|---|
| JP | 57169257 A | * 10/1982 | ....... H01L 21/67132 |
| JP | 2016096235 A | 5/2016 | |
| WO | 2014185446 A1 | 11/2014 | |

* cited by examiner

PICKING UP IRREGULAR SEMICONDUCTOR CHIPS

BACKGROUND

Technical Field

The present invention generally relates to semiconductor chips, and more particularly to picking up irregular semiconductor chips.

Description of the Related Art

During the manufacturing and/or processing of semiconductor chips, irregular semiconductor chips often need to be picked up from a batch of regular semiconductor chips. Thus, there is a need for a mechanism for picking up irregular semiconductor chips.

SUMMARY

According to an aspect of the present invention, a chip pickup system is provided. The chip pickup system includes a detector for detecting a position of an irregular semiconductor chip on a holder. The holder holds a plurality of semiconductor chips in predetermined positions on the holder. The irregular semiconductor chip is out of the predetermined positions. The chip pickup system further includes a pickup tool for picking up the irregular semiconductor chip at least on the basis of information on the position of the irregular semiconductor chip detected by the detector.

According to another aspect of the present invention, a semiconductor manufacturing system is provided. The semiconductor manufacturing system includes a transfer portion for transferring a plurality of semiconductor chips. The transfer portion includes a holder. The holder holds the plurality of semiconductor chips in predetermined positions on the holder. The semiconductor manufacturing system further includes a detector for detecting a position of an irregular semiconductor chip on the holder. The irregular semiconductor chip is out of the predetermined positions. The semiconductor manufacturing system also includes a pickup tool for picking up the irregular semiconductor chip at least on the basis of information on the position of the irregular semiconductor chip detected by the detector. The semiconductor manufacturing system further includes a bonding portion for receiving the plurality of semiconductor chips via the transfer portion. The bonding portion bonds the plurality of semiconductor chips to a substrate.

According to yet another aspect of the present invention, a method for picking up an object is provided. The method includes detecting a position of an object on a holder. The holder holds a plurality of semiconductor chips in predetermined positions on the holder. The object is out of the predetermined positions. The method further includes picking up the object at least on the basis of information on the detected position of the object.

DETAILED DESCRIPTION

Hereinafter, exemplary embodiments of the present invention will be described in detail with reference to the attached drawings.

It is to be noted that the present invention is not limited to these exemplary embodiments to be given below and can be implemented with various modifications within the scope of the present invention. In addition, the drawings used herein are for purposes of illustration, and may not show actual dimensions.

Figure 1:
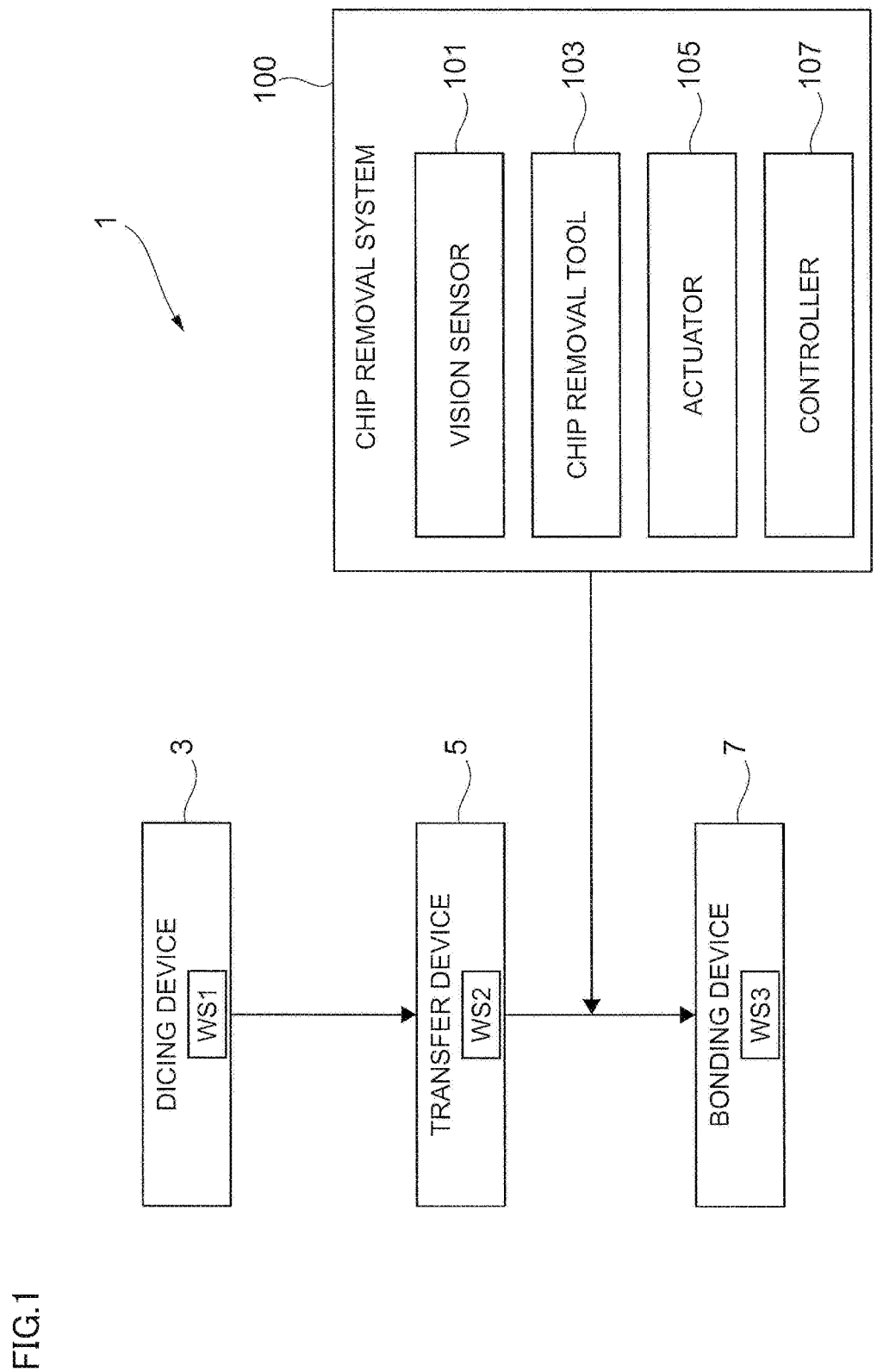
FIG. 1 depicts a block diagram showing a configuration of a semiconductor manufacturing system according to an embodiment of the present invention.

FIG. 1 depicts a block diagram showing a configuration of a semiconductor manufacturing system 1 according to an embodiment of the present invention.

As shown in FIG. 1, the semiconductor manufacturing system 1 can include a dicing device 3, a transfer device 5, a bonding device 7, and a chip removal system 100. The chip removal system 100 is an example of a chip pickup system.

Figure 2A:
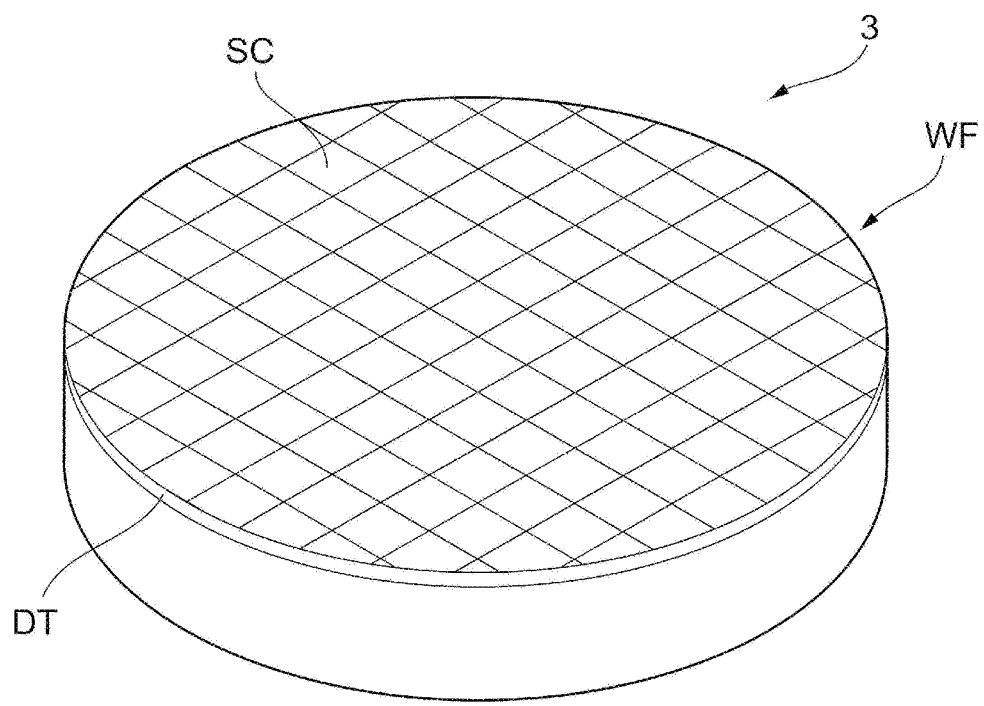
FIGS. 2A and 2B depict a schematic view and a sectional side view, respectively, of semiconductor chips at the first step of the fabrication process according to an embodiment of the present invention.

The dicing device 3 cuts a wafer WF (refer to FIG. 2A) into individual semiconductor chips SC (refer to FIG. 2A). The dicing device 3 includes a first wafer support WS1 on which the wafer WF is mounted. The first wafer support WS1 is a glass substrate provided with an adhesive (a dicing tape DT, refer to FIG. 2B) on a surface of the substrate to hold the wafer WF. The dicing device 3 cuts the wafer WF with reactive ion etching. Note that other conventional cutting techniques, such as blade or laser cutting, are also applicable to the dicing device 3.

The transfer device 5 transfers the semiconductor chips SC (target chips TC described later) from the dicing device 3 to the bonding device 7. The transfer device 5 includes a second wafer support WS2 to which the semiconductor chips SC are adhered. The second wafer support WS2 moves between the dicing device 3 and the bonding device 7. The second wafer support WS2 is a glass substrate provided with an adhesive (a transfer tape TT, refer to FIG. 4B) on a surface of the substrate to hold the semiconductor chips SC. The adhesive can be a heat resistant adhesive, for example. This configuration enables the transfer device 5 to convey the multiple semiconductor chips SC to the bonding device 7 at one stroke.

Figure 5A:
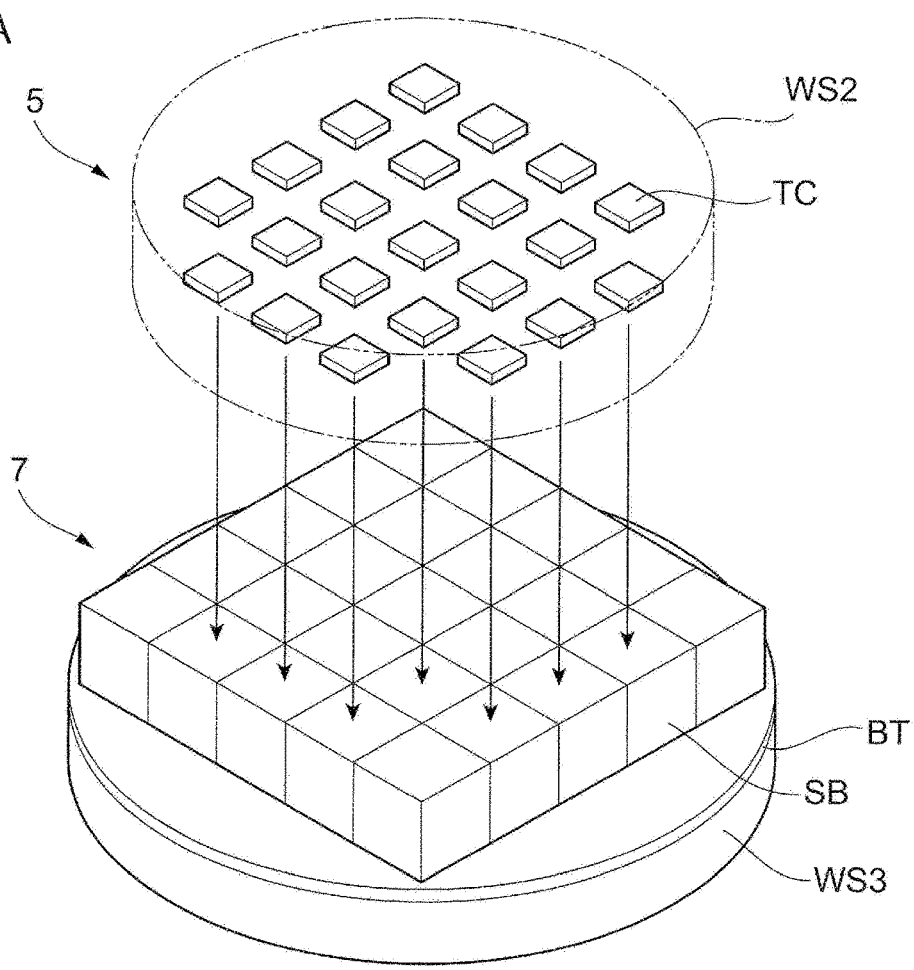
FIGS. 5A and 5B depict a schematic view and a sectional side view, respectively, of the semiconductor chips at the fourth step of the fabrication process according to an embodiment of the present invention.

The bonding device 7 bonds the semiconductor chips SC (the target chips TC) transferred by the transfer device 5 to corresponding substrates SB (refer to FIG. 5A). The bonding device 7 includes a third wafer support WS3 on which semiconductor chips SC are mounted. The third wafer support WS3 is a glass substrate provided with an adhesive (a backing tape BT, refer to FIG. 5B) on a surface of the substrate to hold the substrates SB.

The chip removal system 100 can include a vision sensor 101, a chip removal tool 103, an actuator 105, and a controller 107. The vision sensor 101 detects positions of unexpected chips UC (details later). The chip removal tool 103 removes the unexpected chips UC from the second wafer support WS2. The actuator 105 moves the vision sensor 101 and the chip removal tool 103. The controller 107 controls the vision sensor 101, the chip removal tool 103 and the actuator 105.

The transfer device 5 is an example of a transfer portion. The bonding device 7 is an example of a bonding portion. The vision sensor 101 is an example of a detector. The vision sensor 101 detects information of positions of the unexpected chips UC. The chip removal tool 103 is an example of a chip pickup tool. The second wafer support WS2 is an example of a holder. The transfer tape TT is an example of a bonding surface.

Next, an explanation is given about a fabrication process of a semiconductor according to an embodiment of the present invention.

Figure 2B:
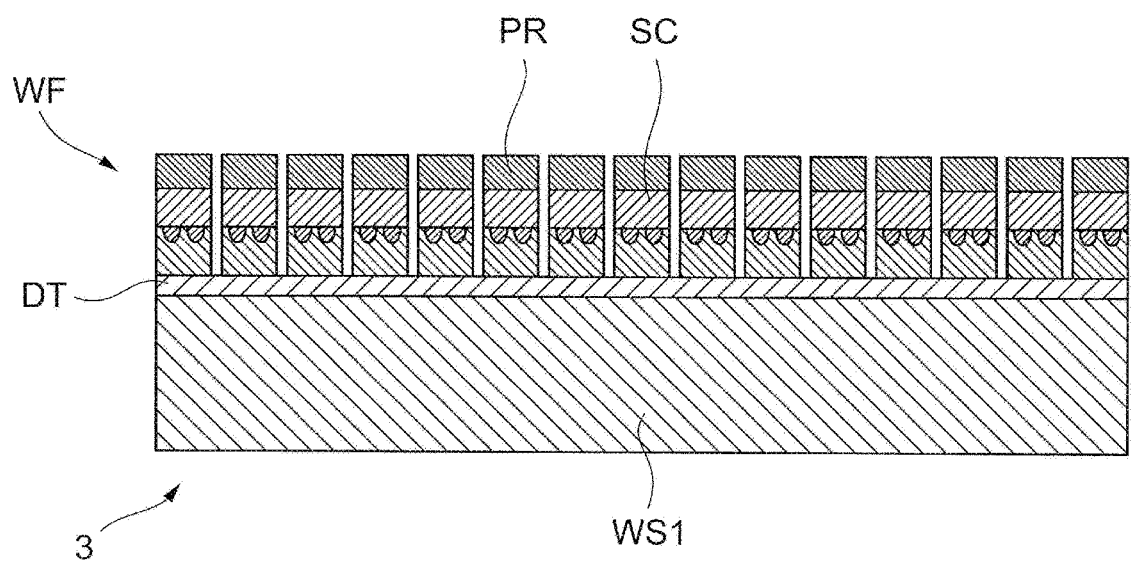

Referring to FIGS. 2A and 2B, there are shown a schematic view and a sectional side view, respectively, of the semiconductor chips SC at the first step of the fabrication process according to an embodiment of the present invention. At this step, the wafer WF is cut into the individual semiconductor chips SC. More specifically, a photo resist PR is provided on a surface of the wafer WF and the wafer WF is cut by reactive ion etching. The first wafer support WS1 of the dicing device 3 holds the wafer WF with the dicing tape DT. The dicing tape DT is provided with an UV-curable adhesive. Note that the size of each semiconductor chip SC is less than 5 mm, preferably less than 1 mm, more preferably 50 um to 500 um (micro meter). After the wafer WF is cut, the photo resist PR is removed by dry etching, for example.

Figure 3A:
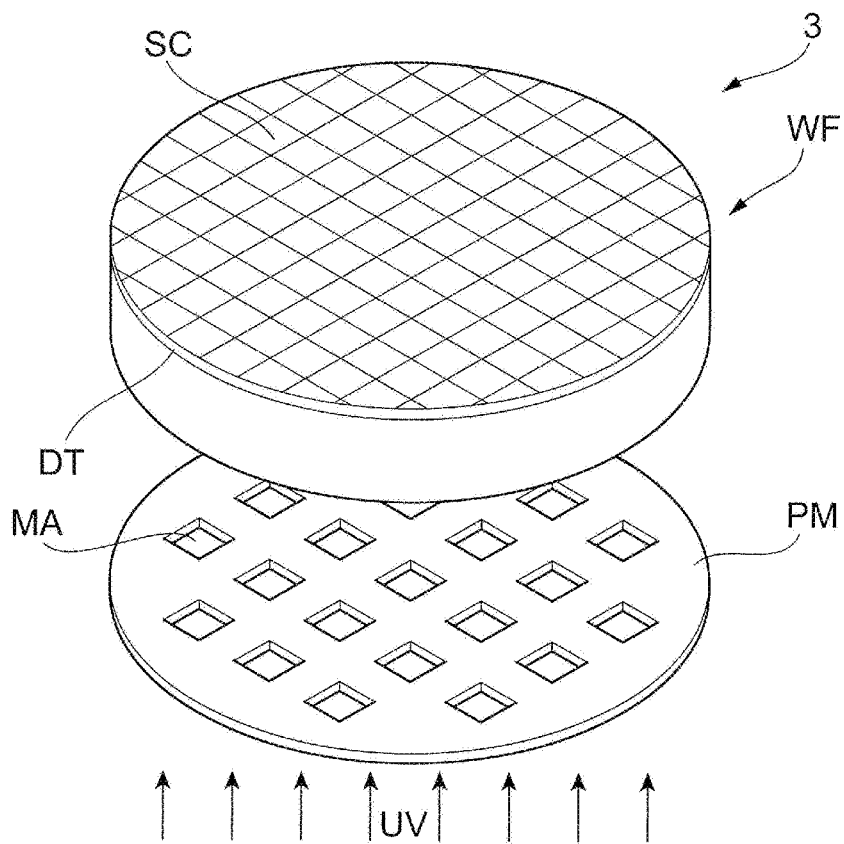
FIGS. 3A and 3B depict a schematic view and a sectional side view, respectively, of the semiconductor chips at the second step of the fabrication process according to an embodiment of the present invention.
Figure 3B:
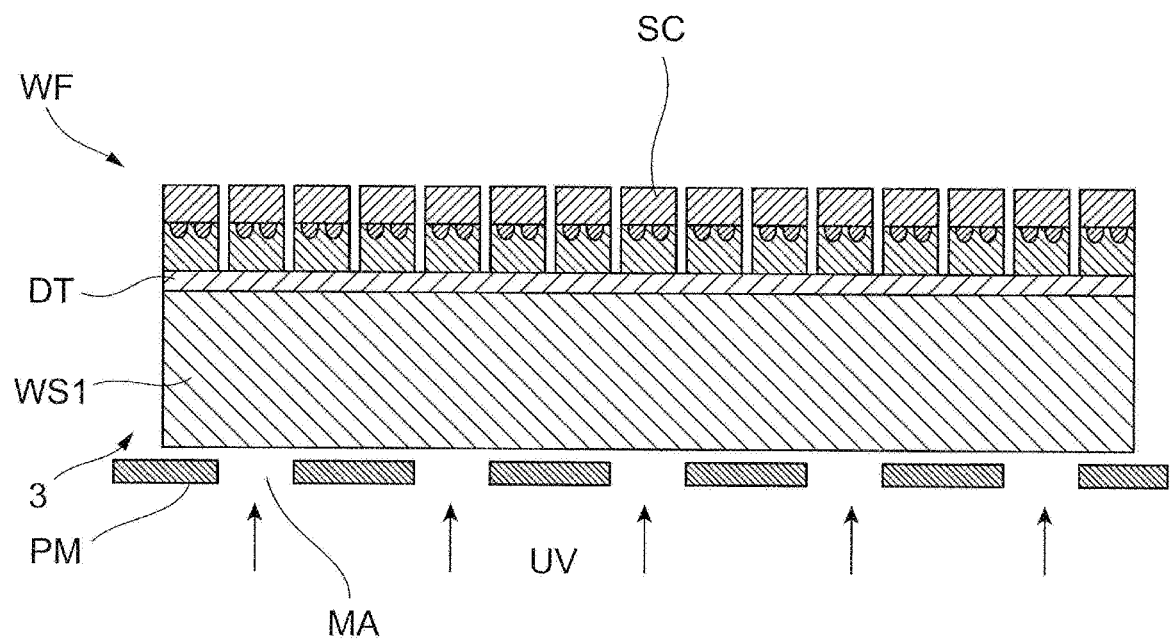

Referring to FIGS. 3A and 3B, there are shown a schematic view and a sectional side view, respectively, of the semiconductor chips SC at the second step of the fabrication process according to an embodiment of the present invention. At this step, a photo mask PM is applied on a back side of the first wafer support WS1. The photo mask PM is provided with mask apertures MA whose positions correspond to the semiconductor chips SC to be peeled off at this process. Then the dicing tape DT is irradiated with UV light through the apertures MA, so that adhesive force between the dicing tape DT and the semiconductor chips SC in positions corresponding to the apertures MA reduces.

Note that the semiconductor chips SC to be peeled off at this process are hereinafter called "target chips TC". The other semiconductor chips SC not to be peeled off, in other words the other semiconductor chips SC to remain on the first wafer support WS1 at this process are hereinafter called "remaining chips RC".

Figure 4A:
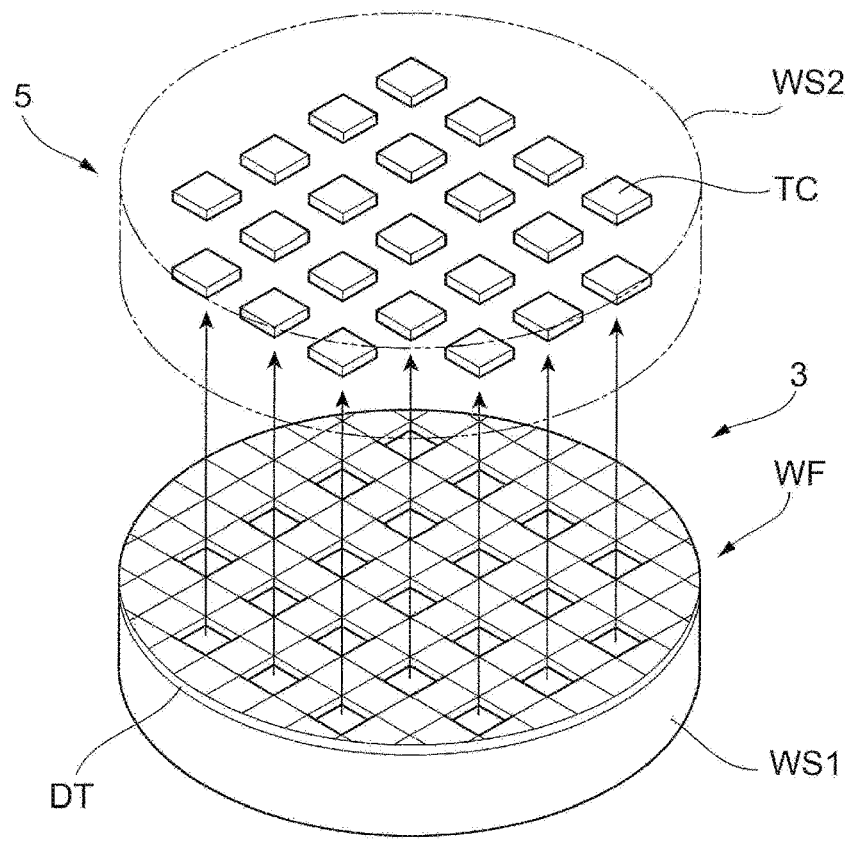
FIGS. 4A and 4B depict a schematic view and a sectional side view, respectively, of the semiconductor chips at the third step of the fabrication process according to an embodiment of the present invention.
Figure 4B:
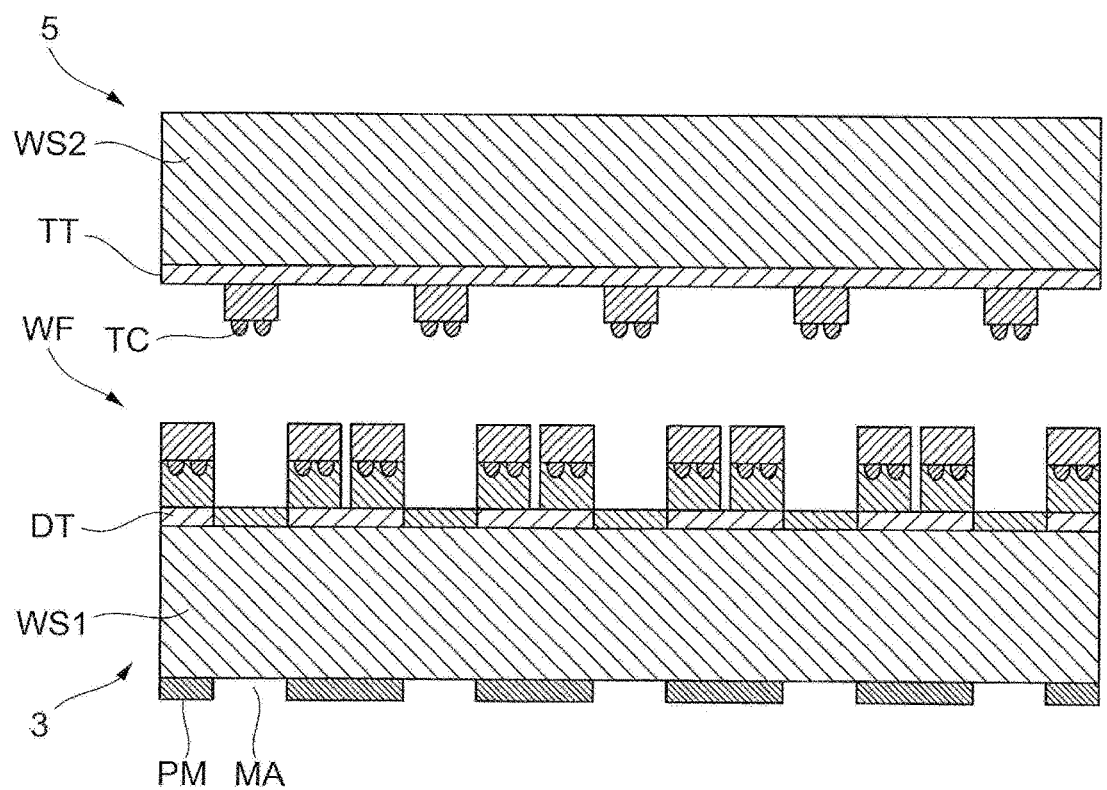

Referring to FIGS. 4A and 4B, there are shown a schematic view and a sectional side view, respectively, of the semiconductor chips SC at the third step of the fabrication process according to an embodiment of the present invention. At this step, the second wafer support WS2 moves towards the first wafer support WS1 from above, so that the transfer tape TT contacts the semiconductor chips SC. The second wafer support WS2 then moves away from the semiconductor chips SC to pick up the target chips TC. In other words, the second wafer support WS2 picks up the multiple target chips TC from the semiconductor chips SC to conduct a partial chip transfer. Note that the target chips TC adhering to the transfer tape TT are held in an identical plane.

Figure 5B:
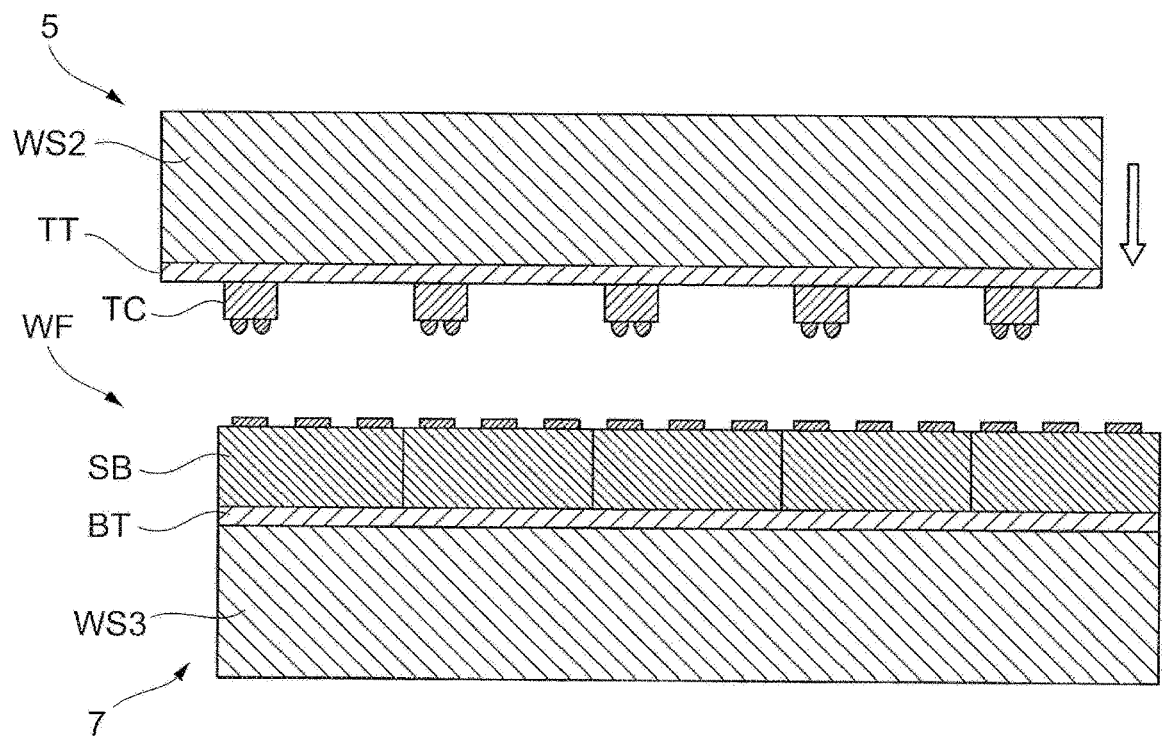

Referring to FIGS. 5A and 5B, there are shown a schematic view and a sectional side view, respectively, of substrates SB at the forth step of the fabrication process according to an embodiment of the present invention. At this step, the second wafer support WS2 holding the target chips TC moves towards the third wafer support WS3 from above, so that the target chips TC contacts the substrates SB to bond thereto. This enables bonding multiple (many) target chips TC to the substrates SB with one stroke (simultaneously).

If the remaining chips RC on the first wafer support WS1 are needed to be picked up, the above operation is repeated with another photo mask PM.

Figure 6:
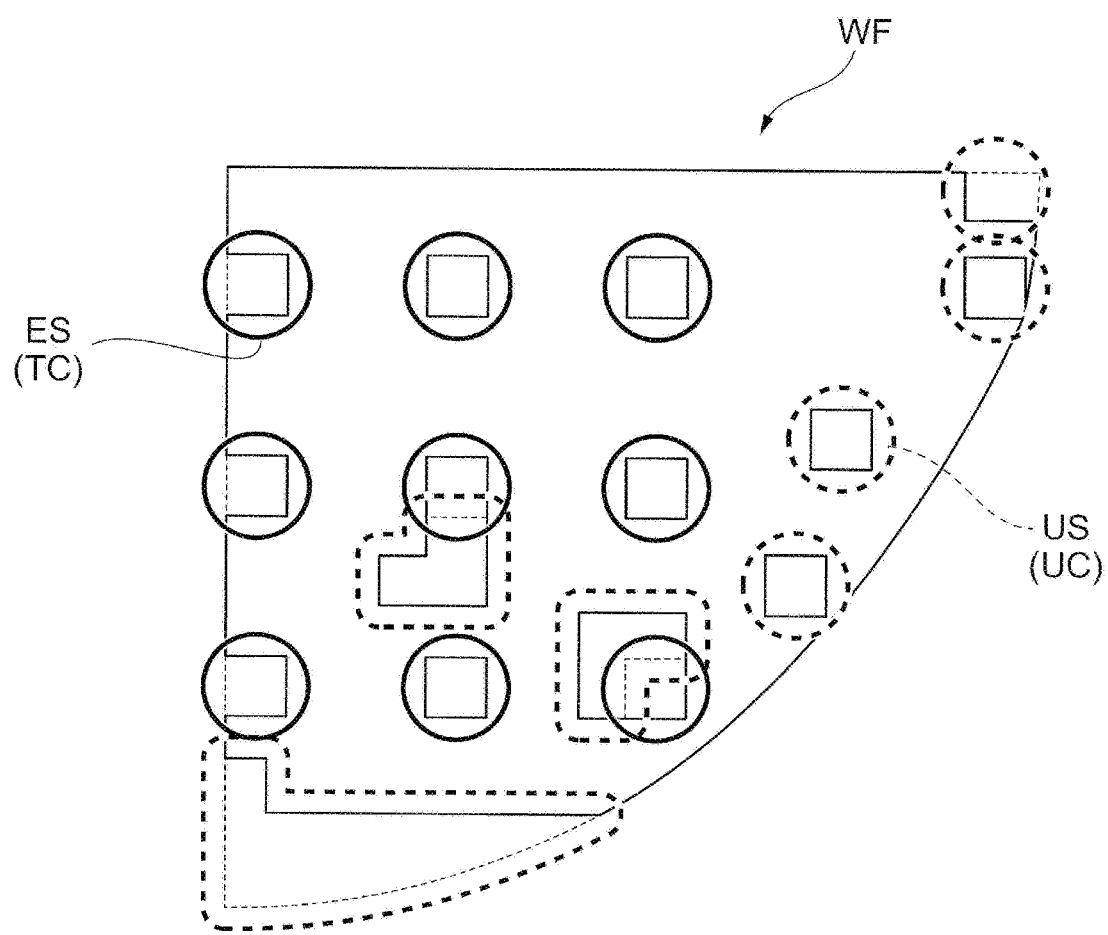
FIG. 6 depicts a wafer after picking up the target chips.

FIG. 6 depicts the wafer WF after picking up the target chips TC. The target chips TC on the wafer WF are picked up by the second wafer support WS2. When the target chips TC are picked up, other semiconductor chips SC can be unexpectedly attached to the second wafer support WS2 together with the target chips TC.

Such unexpectedly attached semiconductor chips SC are hereinafter called "unexpected chips UC". A transfer of the unexpected chips UC from the wafer WF to the second wafer support WS2 is hereinafter called "unexpected transfer". One of the unexpected chips UC is an example of an irregular semiconductor chip.

As shown in the FIG. 6, the wafer WF is provided with holes (spaces). The spaces can include expected spaces ES from which the target chips TC have been picked up, and unexpected spaces US from which the unexpected chips UC have been picked up. Note that the expected spaces ES correspond to UV radiated areas through the mask apertures MA of the photo mask PM at the second step of the fabrication process (refer to FIGS. 3A and 3B).

The root cause of the unexpected transfer may be insufficient adhesive force between the wafer WF and the dicing tape DT (refer to FIG. 2B) except for the areas where the target chips TC are located (the expected spaces ES). This insufficient adhesive force may be caused by contaminations (foreign materials, chipped wafers (silicon), fibers) between the wafer WF and the dicing tape DT or caused by incomplete adhesion between the wafer WF and the dicing tape DT. Note that the size of the semiconductor chips SC is small. If the contaminations are present in a contact area between the wafer WF and the dicing tape DT, the contaminations occupy a relatively large area in the contact area.

This may decrease the adhesive force between the wafer WF and the dicing tape DT significantly.

Figure 7:
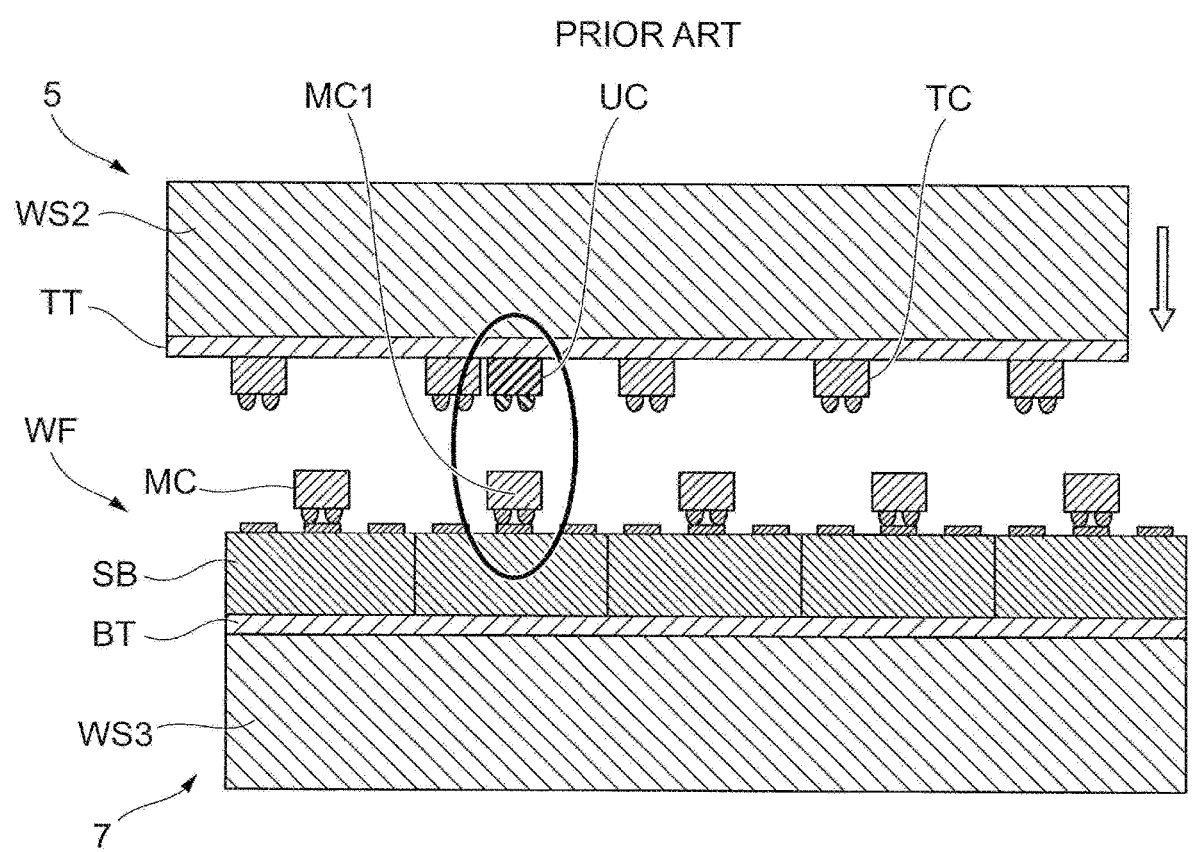
FIG. 7 depicts a sectional side view of the second wafer support with an unexpected chip at the bonding step in a prior art.

FIG. 7 depicts a sectional side view of the second wafer support WS2 with an unexpected chip UC at the bonding step in a prior art. Note that each substrate SB in FIG. 7 holds mounted chips MC which have been delivered by the second wafer support WS2 in a previous bonding process. The target chips TC are held by the second wafer support WS2 in predetermined positions on the transfer tape TT. The unexpected chip UC is also held by the second wafer support WS2 out of the predetermined positions on the transfer tape TT.

The unexpected transfer may cause failures at the bonding step. As shown in FIG. 7, the unexpected chip UC is adhered to the second wafer support WS2. In the shown example, a position of the unexpected chip UC on the second wafer support WS2 corresponds to one of the mounted chips MC, i.e. the first mounted chip MC1 on the substrate SB. As the second wafer support WS2 moves towards the third wafer support WS3, the unexpected chip UC abuts against the first mounted chip MC1. This delivers insufficient bonding force between the substrates SB and the target chips TC. More specifically, the bonding force of the target chips TC arranged around the unexpected chip UC on the second wafer support WS2 may be insufficient. One unexpected chip UC causes many defects in the substrates SB. The number of defects in the substrates SB may be tens or hundreds. The shape of the substrate SB is not limited to the shown example. For example, the substrate SB can have a plate shape. Each one of the substrates SB can be provided with multiple target chips TC.

Figure 8A:
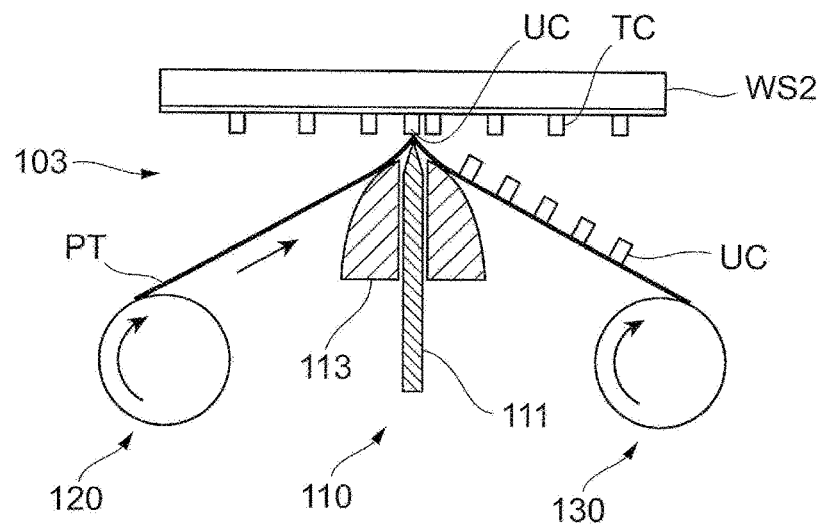
FIG. 8A depicts a schematic side view of a chip removal tool according to an embodiment of the present invention.
Figure 8B:
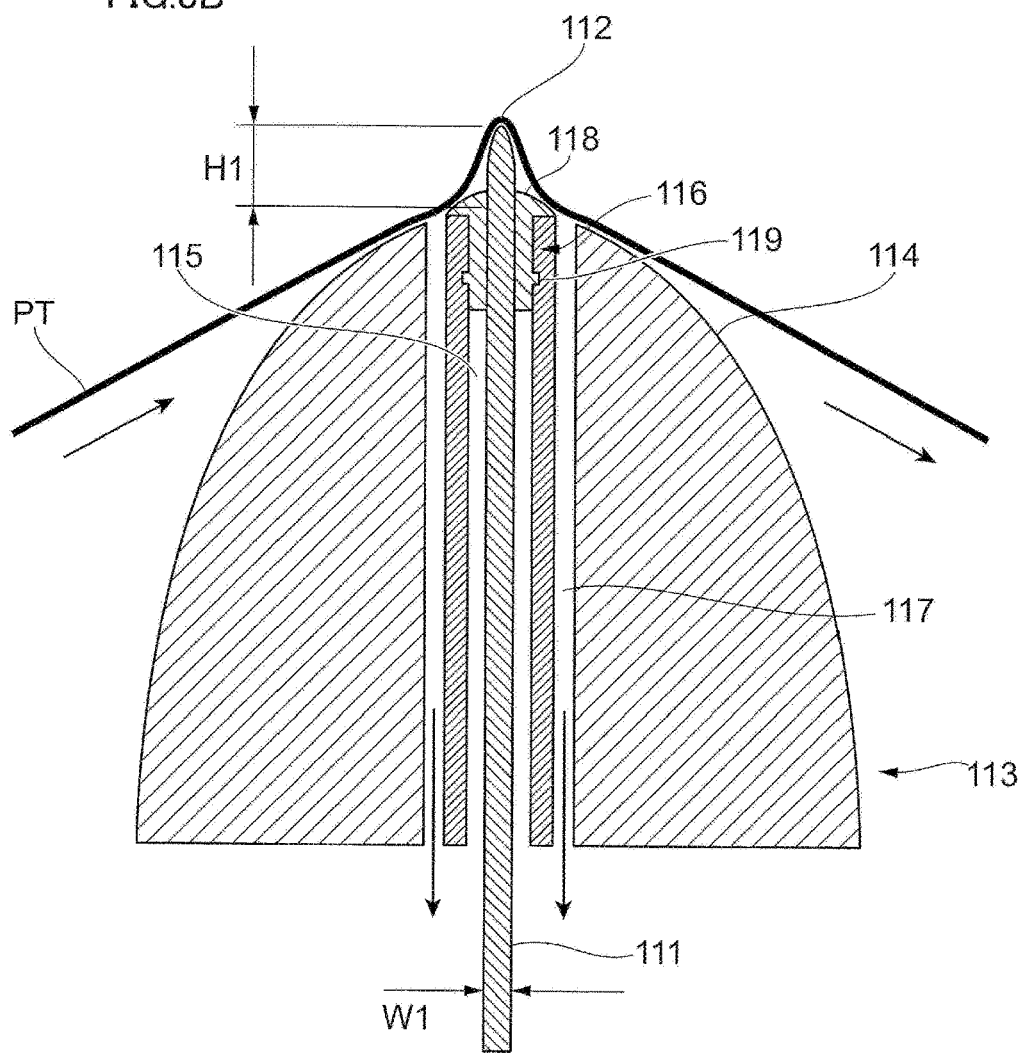
FIGS. 8B and 8C depict a side view and a top view, respectively, of the guide according to an embodiment of the present invention.
Figure 8C:
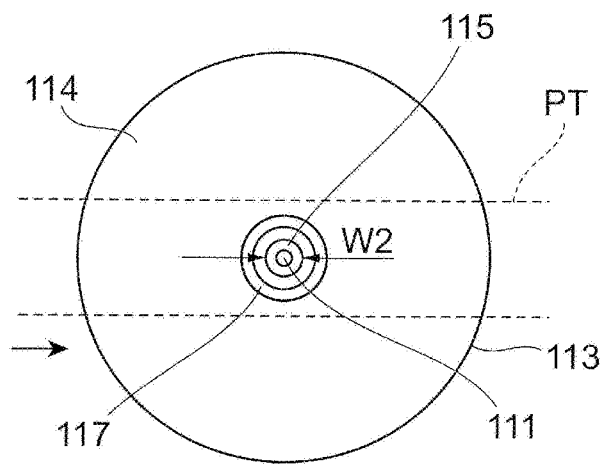
Figure 8D:
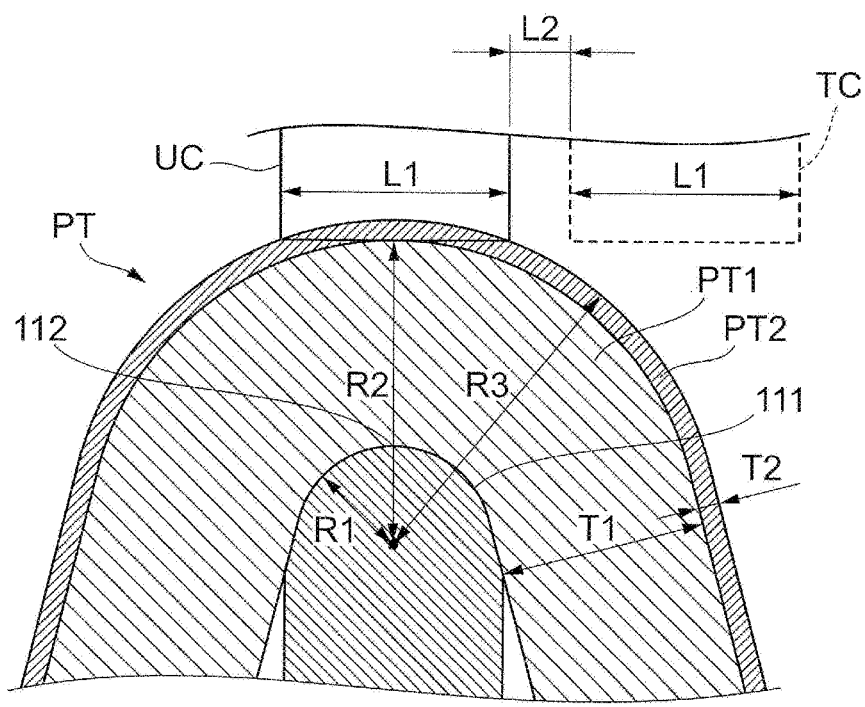
FIG. 8D depicts a pickup tape around a tip of the needle according to an embodiment of the present invention.

FIG. 8A depicts a schematic side view of a chip removal tool 103 according to an embodiment of the present invention. FIGS. 8B and 8C depict a side view and a top view, respectively, of a guide body 113 according to an embodiment of the present invention. FIG. 8D depicts a pickup tape PT around a tip 112 of a needle 111 according to an embodiment of the present invention.

As shown in FIG. 8A, the chip removal tool 103 can include a picker head 110, a tape feeder 120, a tape winder 130 and a pickup tape PT. In an embodiment of the present invention, the pickup tape PT is provided with an adhesive on a surface of the pickup tape PT. The pickup tape PT also has a band shape and is provided with a roll. The pickup tape PT is an example of an adhesive portion.

The picker head 110 picks up each one of the unexpected chips UC from the second wafer support WS2. More specifically, the picker head 110 pushes a back side of the pickup tape PT with the needle 111 towards the second wafer support WS2 so that each one of the unexpected chips UC contacts the adhesive side of the pickup tape PT to be attached thereto.

The tape feeder 120 feeds the pickup tape PT to the picker head 110 by rotating the roll of the pickup tape PT. The tape winder 130 winds the pickup tape PT at a downstream side of the picker head 110 in the moving direction of the pickup tape PT.

In an embodiment of the present invention, the pickup tape PT conveys the unexpected chips UC which adhere to the adhesive of the pickup tape PT. The tape winder 130 winds the pickup tape PT together with the adhered unexpected chips UC.

As shown in FIG. 8B, the picker head 110 can include the needle 111 and the guide body 113. The needle 111 moves back and forth against the second wafer support WS2. In other words, the needle 111 is capable of protruding from the guide body 113 or withdrawing into the guide body 113. The tip 112 of the needle 111 abuts against the back side of the pickup tape PT.

The guide body 113 has a generally cone shape with a rounded tip. More specifically, the guide body 113 is provided with a protruding portion 114 towards the second wafer support WS2. The protruding portion 114 has a curved surface. The pickup tape PT moves along this curved surface.

The guide body 113 is provided with a needle hole 115 and a vacuum groove 117. The needle hole 115 and the vacuum groove 117 are opposed to the pickup tape PT. The needle hole 115 is formed on the tip of the guide body 113. In the needle hole 115, the needle 111 is inserted so that the guide body 113 guides the needle 111 to slide, i.e. to move back and forth against the second wafer support WS2. In the shown example, a positioning piece 116 is provided in the needle hole 115. The positioning piece 116 positions the needle 111 on the center of the needle hole 115. The positioning piece 116 has a generally cylindrical shape. More specifically, the positioning piece 116 is provided with a round shape end 118 with large-diameter at the side of the tip of the guide body 113. The positioning piece 116 is provided with a protrusion 119 protruding from the peripheral surface of the positioning piece 116 for fixing the position of the positioning piece 116 in the guide body 113. The positioning piece 116 can be made of a slippery surface material, such as polytetrafluoroethylene (PTFE). Note that this positioning piece 116 may be omitted as long as the position of the needle 111 is positioned on the center of the needle hole 115. The vacuum groove 117 is formed around the needle hole 115. The vacuum groove 117 has a ring shape in top view (refer to FIG. 8C). The vacuum suction force is applied to the pickup tape PT through the vacuum groove 117.

When the needle 111 protrudes from the guide body 113, the pickup tape PT is pushed towards the second wafer support WS2. With the vacuum suction force applied through the vacuum groove 117, the pickup tape PT is pulled toward the guide body 113. This enables the pickup tape PT to have a curved shape with a pointed tip. The vacuum suction force decreases an area of the pickup tape PT opposed to each of the unexpected chips UC.

The distance between the second wafer support WS2 and the roll of the pickup tape PT in the tape feeder 120 or the tape winder 130 is larger than the distance between the second wafer support WS2 and the tip of the guide body 113. This configuration enables to keep the pickup tape PT away from the second wafer support WS2, before and after passing the tip of the guide body 113, to prevent the target chips TC from adhering to the pickup tape PT with the unexpected chips UC.

As shown in FIG. 8D, the pickup tape PT is provided with a base film PT1 and an adhesive PT2. For example, a thickness T1 of the base film PT1 is 80 um (micro meter) and a thickness T2 of the adhesive PT2 is 10 um. Elongation of the base film PT1 is more than 100%. The needle 111 is provided with the tip 112 having a round shape and the pickup tape PT has a curved shape around the tip 112 of the needle 111.

For example, the base film outer radius R2 is 120 um and the adhesive outer radius R3 is 130 um. A needle width (diameter) W1 is 3 mm. A needle height H1, i.e. the maximum protrusion height of the needle from the guide body 113, is 4 mm. A tip angle of the tip 112 is from 10 to 30 degrees. A diameter W2 of the needle hole 115 is 5 mm. A length L1 of the unexpected chip UC or the target chip TC is 100 um. A distance L2 between the unexpected chip UC and the target chip TC is 10 um. A thickness of the unexpected chip UC is thinner than a total thickness of the pickup tape PT.

In the above conditions, a needle tip radius (needle peak radius) R1 can be less than 40 um to decrease the area of the pickup tape PT opposed to each one of the unexpected chips UC. Note that the needle tip radius R1 is variable based on the thickness of the pickup tape PT, or the length L1 of the unexpected chip UC.

Instead of using the pickup tape PT, the vacuum suction can be applicable to pick up the unexpected chips UC as a prior art. In other words, the unexpected chip UC can be picked up with a vacuum head (not shown) directly instead of using the above mentioned pickup tape PT. However, the size of the unexpected chips UC is so small that an area of the unexpected chips UC for the vacuum suction is also small. This configuration may cause insufficient vacuum force.

Figure 9A:
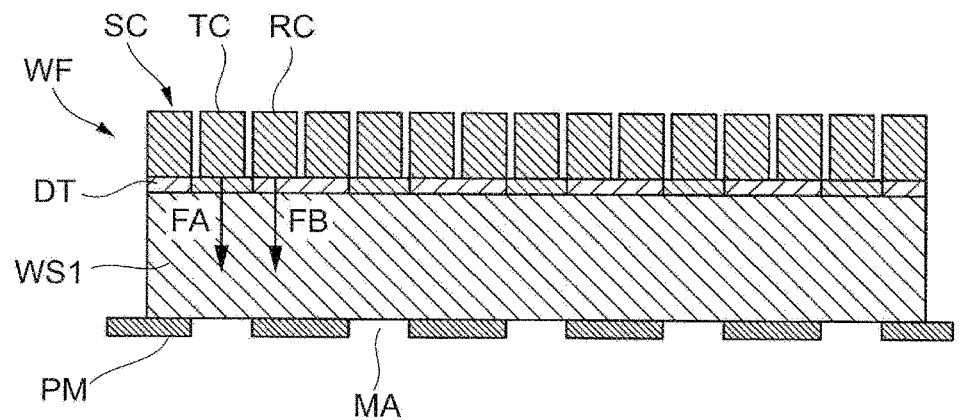
FIG. 9A depicts adhesive force of the dicing tape according to an embodiment of the present invention.
Figure 9B:
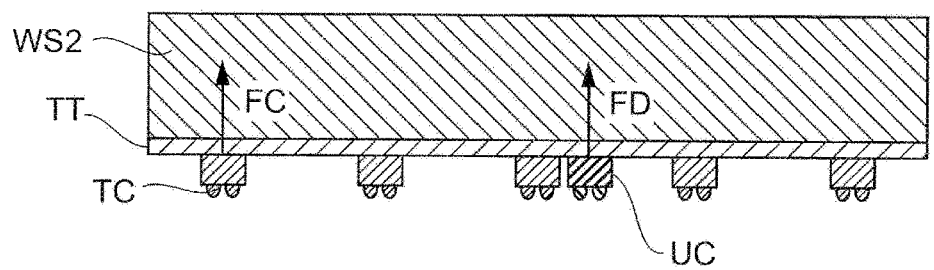
FIG. 9B depicts adhesive force of the transfer tape according to an embodiment of the present invention.
Figure 9C:
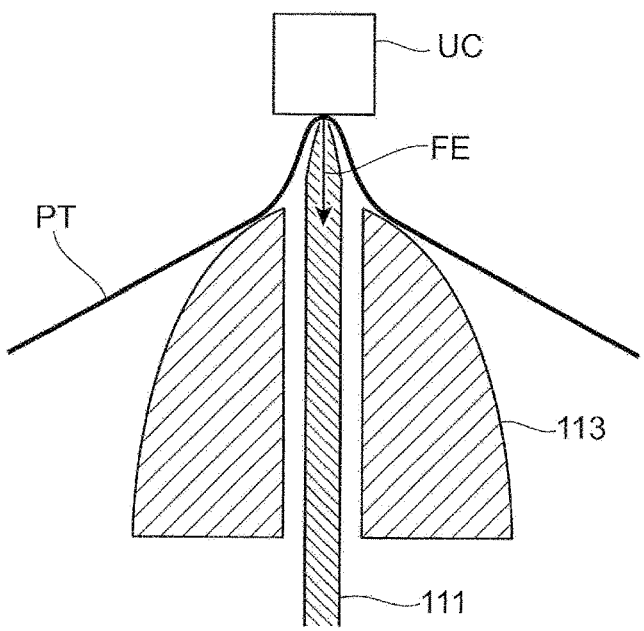
FIG. 9C depicts adhesive force of the pickup tape according to an embodiment of the present invention.

FIG. 9A depicts adhesive force FA and FB of the dicing tape DT according to an embodiment of the present invention. FIG. 9B depicts adhesive force FC and FD of the transfer tape TT according to an embodiment of the present invention. FIG. 9C depicts adhesive force FE of the pickup tape PT according to an embodiment of the present invention.

Next, an explanation is given about the relationship of the adhesive force among the dicing tape DT, the transfer tape TT, the pickup tape PT. As mentioned above, the semiconductor chips SC are transferred from the dicing device 3 to the bonding device 7 by the transfer device 5. When the transfer device 5 picks up the target chips TC, the target chips TC leave the dicing tape DT provided on the first wafer support WS1 and move with the transfer tape TT provided on the second wafer support WS2. In addition, if the unexpected chips UC are adhered to the transfer tape TT of the second wafer support WS2, the chip removal tool 103 picks up the unexpected chips UC with the pickup tape PT.

To allow for the above pickup of the target chips TC and the unexpected chips UC, the relationship of the adhesive force among the dicing tape DT, the transfer tape TT, the pickup tape PT can be as follows.

Referring to FIG. 9A, the dicing tape DT has areas holding the target chips TC and areas holding the remaining chips RC. While the areas holding the target chips TC are to be irradiated with UV light through the mask apertures MA of the photo mask PM, the areas holding the remaining chips RC are not to be irradiated with UV light. After UV irradiation, the adhesive force FA between the target chips TC and the dicing tape DT is less than the adhesive force FB between the remaining chips RC and the dicing tape DT (FA<FB).

Referring to FIGS. 9A and 9B, the adhesive force FC between the target chips TC and the transfer tape TT is larger than the adhesive force FA between the target chips TC and the dicing tape DT (FC>FA) to pick up the target chips TC. The adhesive force FC is less than the adhesive force FB between the remaining chips RC and the dicing tape DT (FC<FB) not to pick up the remaining chips RC. The adhesive force FD between the unexpected chips UC and the transfer tape TT is assumed to be equal to the adhesive force FC (FD=FC).

Referring to FIGS. 9B and 9C, the adhesive force FE between the unexpected chips UC and the pickup tape PT is larger than the adhesive force FD between the unexpected chips UC and the transfer tape TT (FE>FD) to pick up the unexpected chips UC.

The relationship between the adhesive force FA, FB, FC, FD, and FE is expressed by the expression: FA<FC (FD)<FB<FE.

Next, a detailed explanation is given about the adhesive force FB between the remaining chips RC and the dicing tape DT. In an embodiment of the present invention, a reduction of the adhesive force FB can cause the unexpected chips UC (the unexpected transfer). More specifically, if an interference of the wafer WF and the dicing tape DT is contaminated, the adhesive force FB may be less than the adhesive force FC between the target chips TC and the transfer tape TT (FB<FC). In this condition, the remaining chips RC may be unexpectedly adhered to the transfer tape TT when the transfer tape TT picks up the target chips TC. The remaining chips RC adhering to the transfer tape TT constitute the unexpected chips UC.

Figure 10:
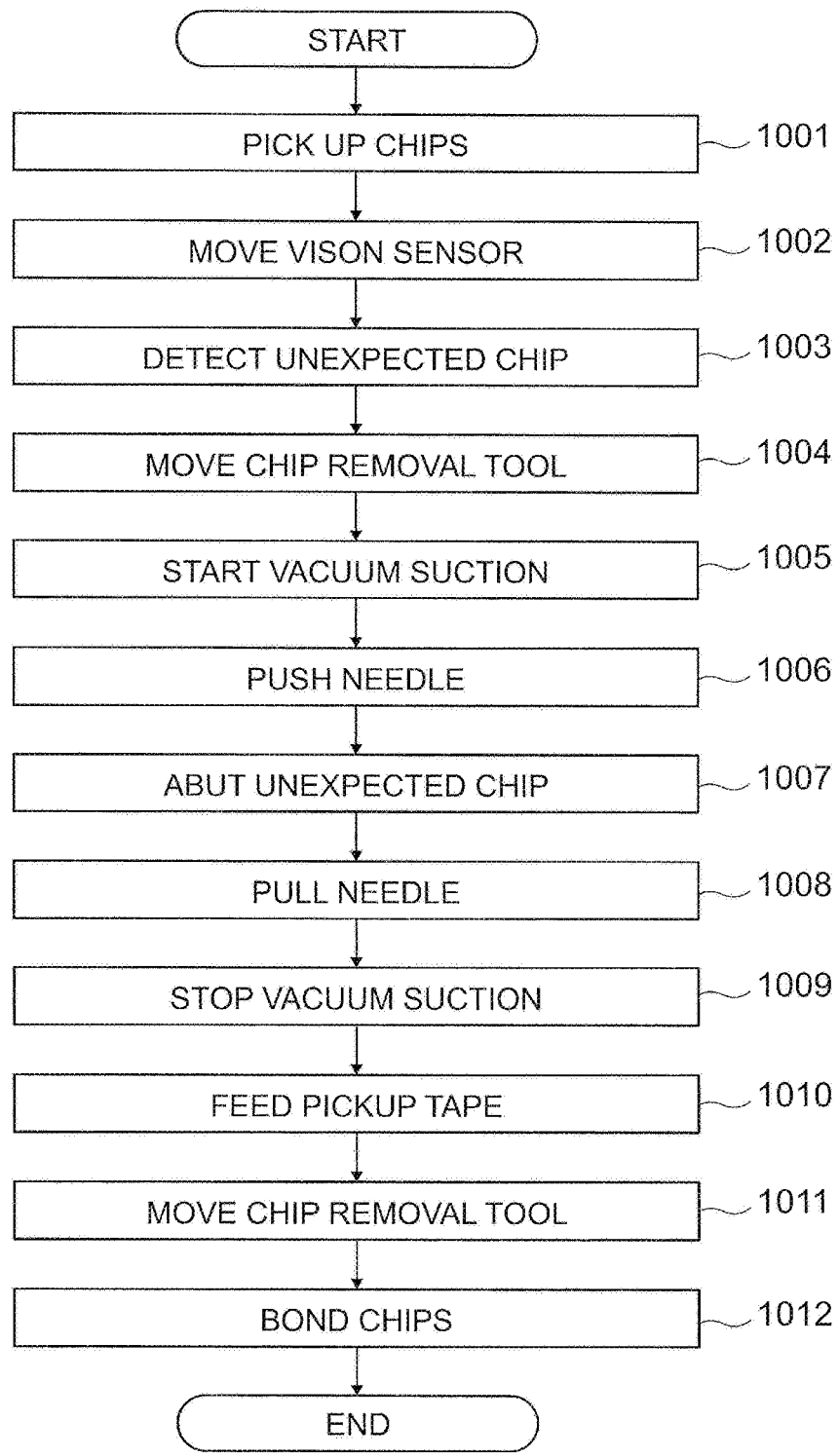
FIG. 10 depicts a flowchart representing an operation of the transfer device and the chip removal system according to an embodiment of the present invention.

FIG. 10 depicts a flowchart representing an operation of the transfer device 5 and the chip removal system 100 according to an embodiment of the present invention. Referring to FIGS. 1 and 10, the operation of the transfer device 5 and the chip removal system 100 will be described. The wafer WF is assumed to have been cut into the semiconductor chips SC, and the vision sensor 101 and the chip removal tool 103 are on respective home positions.

The transfer device 5 picks up the target chips TC with the transfer tape TT of the second wafer support WS2 (step 1001). The actuator 105 of the chip removal system 100 moves the vision sensor 101 to a position opposed to the surface of the second wafer support WS2, i.e. the transfer tape TT (step 1002). The vision sensor 101 detects a position of the unexpected chip UC on the transfer tape TT (step 1003). The actuator 105 then moves the vision sensor 101 to the home position.

The actuator 105 then moves the chip removal tool 103, on the basis of the detection result at step 1003, from the home position to a position opposed to the unexpected chip UC (step 1004). The chip removal tool 103 starts vacuum suction thorough the vacuum groove 117 (step 1005). The actuator 105 pushes the needle 111 to protrude from the guide body 113 (step 1006) until the pickup tape PT abuts the unexpected chip UC (step 1007).

The actuator 105 then pulls the needle 111 to remove (detach) the unexpected chip UC from the transfer tape TT (step 1008). The chip removal tool 103 stops vacuum suction (step 1009).

The tape feeder 120 then feeds the pickup tape PT and the tape winder 130 winds the pickup tape PT (step 1010). Note that the tape winder 130 winds the pickup tape PT together with the attached unexpected chip UC.

The actuator 105 then moves the chip removal tool 103 to the home position (step 1011). Then the transfer device 5 transfers the target chips TC to the substrate SB on the bonding device 7 to bond the target chips TC to the substrate SB (step 1012). If multiple unexpected chips UC are detected at step 1003, the above procedures from step 1004 to step 1010 are repeated.

The order of the above mentioned steps is not limited to this. For example, the actuator 105 can move the chip removal tool 103 (refer to step 1004), after the chip removal tool 103 starts vacuum suction (refer to step 1005) and pushes the needle 111 to protrude from the guide body 113 (refer to step 1006).

Figure 11A:
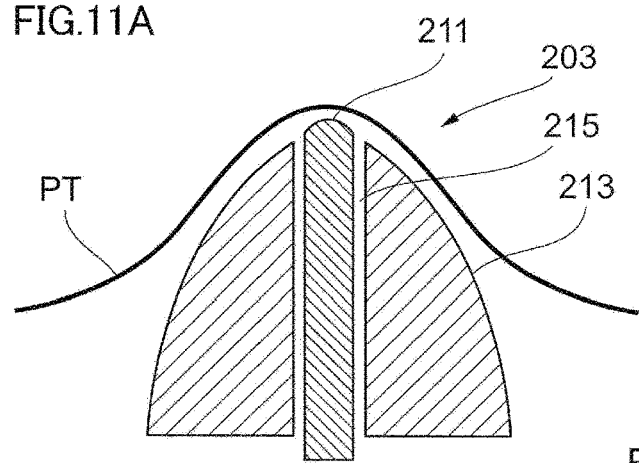
FIGS. 11A and 11B depict a side view of a chip removal tool according to various embodiments of the present invention, respectively.
Figure 11B:
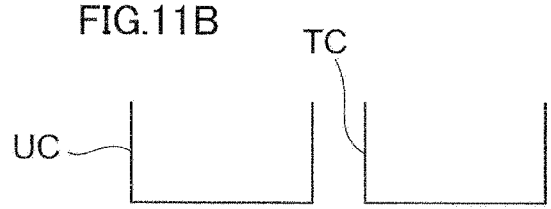
Figure 11C:
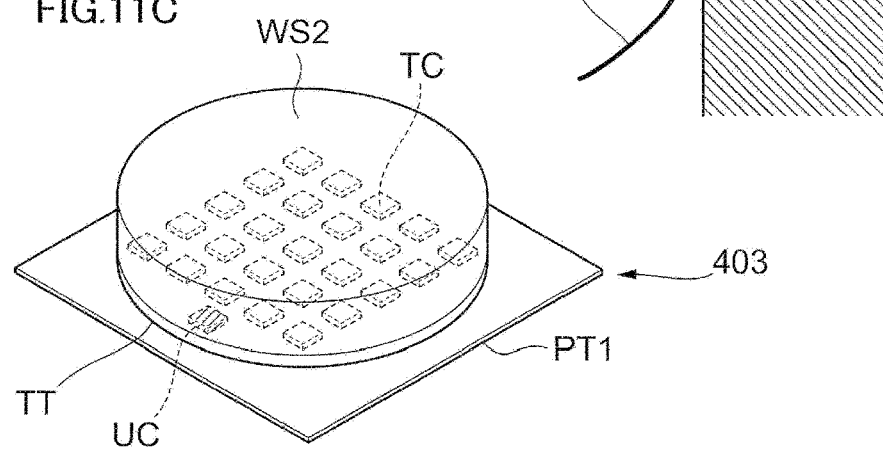
FIGS. 11C and 11D depict a perspective view of a chip removal tool according to various embodiments of the present invention, respectively.
Figure 11D:
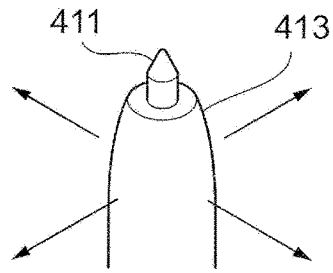
Figure 11D:
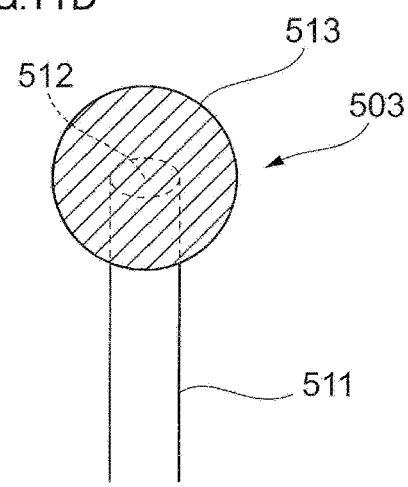

FIGS. 11A and 11B depict a side view of chip removal tools 203 and 303 according to various embodiments of the present invention, respectively. FIGS. 11C and 11D depict a perspective view of chip removal tools 403 and 503 according to various embodiments of the present invention, respectively.

In the above explanation, the guide body 113 is provided with the vacuum groove 117. However, the configuration of the guide body is not limited to this. For example, as shown in FIG. 11A, the guide body 213 can be provided without the vacuum groove 117. In this configuration, the needle 211 moves along the needle hole 215 provided on the guide body 213 and the pickup tape PT is applied with predetermined tension to decrease an area of the pickup tape PT opposed to each one of the unexpected chips UC.

The needle 111 is provided with the tip 112 having a rounded shape. However, the configuration of the needle is not limited to this. For example, as shown in FIG. 11B, a tip of the needle 311 can have a flat surface 312. An area of the flat surface 312 can be smaller than the unexpected chip UC to prevent the target chips TC adjacent to the unexpected chip UC from being removed by the pickup tape PT.

In the above explanation, the needle 111 and the guide body 113 move with the pickup tape PT. However, the configuration of the needle and the guide body are not limited to this.

As shown in FIG. 11C, the pickup tape PT1 can be provided in the form of a sheet. The pickup tape PT1 has a surface to cover the transfer tape TT. This pickup tape PT1 is in a fixed position, and the needle 411 and the guide body 413 move along the pickup tape PT1. This configuration eliminates a structure to feed and wind the pickup tape PT in the above embodiment of the present invention.

As shown in FIG. 11D, the chip removal tool 503 can be provided with a needle 511 having an adhesive 513 on a tip 512 of the needle 511. In other words, the chip removal tool 503 may not be provided with the guide body 113 and the pickup tape PT.

Also, the transfer device 5 can move the second wafer support WS2 toward the vision sensor 101 or toward the chip removal tool 103, instead of moving the vision sensor 101 and the chip removal tool 103.

Additionally, the chip removal tool 103 can be provided with a retract mechanism. This retract mechanism enables the pickup tape PT to be away from the guide body 113 when the tape feeder 120 feeds the pickup tape PT. This configuration reduces friction between the pickup tape PT and the guide body 113.

Further, the vision sensor 101 can detect a position of the target chip TC having a quality defect, so that the chip removal tool 103 enabling picking up the quality defect target chip TC on the basis of the detected position.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A chip pickup system, comprising:
    a detector for detecting a position of an irregular semiconductor chip on a holder, the holder holding a plurality of semiconductor chips in predetermined positions on the holder, the irregular semiconductor chip is out of the predetermined positions;
    a pickup tool having only one needle disposed therein for picking up the irregular semiconductor chip at least on the basis of information on the position of the irregular semiconductor chip detected by the detector;
    a guide body including a ring-shaped vacuum groove defined between the needle and the guide body, the guide body having a rounded tip such that a tape moves along the rounded tip; and
    a positioning piece including a rounded top end section directly contacting an upper portion of the needle, the rounded top end section including a protrusion employed to fixedly connect the rounded top end section to vertical legs of the positioning piece.

2. The chip pickup system of claim 1, wherein the holder has a bonding surface, and the plurality of semiconductor chips adhere to the bonding surface.

3. The chip pickup system of claim 1, wherein the holder holds the plurality of semiconductor chips on a same plane.

4. The chip pickup system of claim 1, wherein the pickup tool includes an adhesive portion to abut against the irregular semiconductor chip.

5. The chip pickup system of claim 1, wherein the tape has an adhesive portion to abut against the irregular semiconductor chip.

6. The chip pickup system of claim 1, wherein the guide body is cone-shaped.

7. The chip pickup system of claim 5, wherein the needle pushes the tape with a tip of the needle toward the irregular semiconductor chip.

8. The chip pickup system of claim 1, wherein the guide body includes a needle hole and the needle slides in the needle hole.

9. The chip pickup system of claim 8, wherein a vacuum suction force is applied to the tape through the vacuum groove.

10. The chip pickup system of claim 7, wherein the pickup tool includes a feeder feeding the tape, and the irregular semiconductor chip is attached to the tape.

11. The chip pickup system of claim 10, wherein the feeder feeds the tape while the needle is withdrawn in a guide body.

12. A semiconductor manufacturing system, comprising:
a transfer portion for transferring a plurality of semiconductor chips, the transfer portion including a holder, the holder holding the plurality of semiconductor chips in predetermined positions on the holder;
a detector for detecting a position of an irregular semiconductor chip on the holder, the irregular semiconductor chip being out of the predetermined positions;
a pickup tool having only one needle disposed therein for picking up the irregular semiconductor chip at least on the basis of information on the position of the irregular semiconductor chip detected by the detector;
a bonding portion for receiving the plurality of semiconductor chips via the transfer portion, the bonding portion bonding the plurality of semiconductor chips to a substrate;
a guide body including a ring-shaped vacuum groove defined between the needle and the guide body, the guide body having a rounded tip such that a tape moves along the rounded tip; and
a positioning piece including a rounded top end section directly contacting an upper portion of the needle, the rounded top end section including a protrusion employed to fixedly connect the rounded top end section to vertical legs of the positioning piece.

13. The semiconductor manufacturing system of claim 12, wherein the tape has an adhesive portion to abut against the irregular semiconductor chip.

14. The semiconductor manufacturing system of claim 13, wherein a vacuum suction force is applied to the tape through the ring-shaped vacuum groove.

15. A method for picking up an object, the method comprising:
detecting a position of an object on a holder, the holder holding a plurality of semiconductor chips in predetermined positions on the holder, the object being out of the predetermined positions;
picking up the object, via a pickup tool having only one needle disposed therein, at least on the basis of information on the detected position of the object;
a guide body including a ring-shaped vacuum groove defined between the needle and the guide body, the guide body having a rounded tip such that a tape moves along the rounded tip; and
a positioning piece including a rounded top end section directly contacting an upper portion of the needle, the rounded top end section including a protrusion employed to fixedly connect the rounded top end section to vertical legs of the positioning piece.

16. The method of claim 15, wherein the tape has an adhesive portion to abut against the irregular semiconductor chip.

17. The method of claim 16, wherein a vacuum suction force is applied to the tape through the ring-shaped vacuum groove.

* * * * *